United States Patent [19]
Saitoh

[11] Patent Number: 5,617,111
[45] Date of Patent: Apr. 1, 1997

[54] CIRCUIT FOR DRIVING LIQUID CRYSTAL DEVICE

[75] Inventor: Sei Saitoh, Tokyo, Japan

[73] Assignee: NEC Corporation, Tokyo, Japan

[21] Appl. No.: 680,552

[22] Filed: Jul. 9, 1996

Related U.S. Application Data

[63] Continuation of Ser. No. 161,733, Dec. 2, 1993, abandoned.

[30] Foreign Application Priority Data

Dec. 2, 1992 [JP] Japan ................... 4-349886

[51] Int. Cl.$^6$ ................... G09G 3/36
[52] U.S. Cl. ................... 345/100; 345/94; 345/208
[58] Field of Search ................... 345/89, 87, 90, 345/93, 96, 95, 98, 99, 100, 148, 147, 208, 209, 210; 359/54, 55

[56] References Cited

U.S. PATENT DOCUMENTS 5,122,792  6/1992  Stewart ................... 345/148

FOREIGN PATENT DOCUMENTS

| 0264921A3 | 10/1987 | European Pat. Off. | ......... H03M 1/68 |
| 0282034A3 | 3/1988 | European Pat. Off. | ......... H03M 1/68 |
| 0478371A3 | 9/1991 | European Pat. Off. | ......... G09G 3/36 |
| 60-256228 | 12/1985 | Japan | ............................. H03M 1/68 |
| 03227125 | 10/1991 | Japan | ............................. H03M 1/10 |

OTHER PUBLICATIONS

K. Hyugaji et al., "CMOS Driver LSIs for Megapixel Multi-Color TFT-LCDs"; SID 91 Digest, vol. 27, No. 4, pp. 543-546.

*Primary Examiner*—Xiao Wu
*Attorney, Agent, or Firm*—Whitham, Curtis, Whitham & McGinn

[57] ABSTRACT

In a driving circuit for a multiple gray scale liquid crystal device, the least significant half of a given image data is decoded by a sub decoder, and one interpolating voltage is selected from a plurality of interpolating voltages by a sub switch circuit in accordance with the decoded result, so that the selected interpolating voltage Vc is applied across a capacitor. Next, the most significant half of the given image data is decoded by a main decoder, and one main voltage is selected from a plurality of main voltages by a main switch circuit in accordance with the decoded result, so that the selected main voltage Vk is supplied to one terminal of the capacitor. With this, a voltage $V_{CH}$ at the other terminal of the capacitor becomes {Vc+Vk}. Accordingly, by selecting Vc and Vk, it is possible to generate a number of output driving voltages corresponding to a number of gray scale levels, with a reduced number of external voltage supplies and with a reduced cost.

21 Claims, 9 Drawing Sheets

FIGURE 2

| IMAGE INPUT DATA | | | | DRIVE OUTPUT VOLTAGE | TURNED-ON OUTPUT TRANSISTOR |
|---|---|---|---|---|---|
| $D_{n-1}$ | ······ | $D_1$ | $D_0$ | | |
| 0 | ······ | 0 | 0 | $V_1$ | $Q_{11}$ |
| 0 | ······ | 0 | 1 | $V_2$ | $Q_{21}$ |
| 0 | ······ | 1 | 0 | $V_3$ | $Q_{31}$ |
| 0 | ······ | 1 | 1 | $V_4$ | $Q_{41}$ |
| ⋮ | ⋮ | ⋮ | ⋮ | ⋮ | ⋮ |
| 1 | ······ | 1 | 1 | $V_m$ | $Q_{m1}$ |

FIGURE 3

| $D_3$ | $D_2$ | $D_1$ | $D_0$ | FIRST FIELD | SECOND FIELD |
|---|---|---|---|---|---|
| 1 | 1 | 1 | 1 0 | $V_7$ | $V_7$ $V_6$ |
| 1 | 1 | 0 | 1 0 | $V_6$ | $V_6$ $V_5$ |
| 1 | 0 | 1 | 1 0 | $V_5$ | $V_5$ $V_4$ |
| 1 | 0 | 0 | 1 0 | $V_4$ | $V_4$ $V_3$ |
| 0 | 1 | 1 | 1 0 | $V_3$ | $V_3$ $V_2$ |
| 0 | 1 | 0 | 1 0 | $V_2$ | $V_2$ $V_1$ |
| 0 | 0 | 1 | 1 0 | $V_1$ | $V_1$ $V_0$ |
| 0 | 0 | 0 | 1 0 | $V_0$ | $V_0$ $V_0$ |

FIGURE 9

| CONTROL SIGNAL H | MAIN DATA | | | | SWITCH SELECTION |
|---|---|---|---|---|---|
| | $D_{U3}$ | $D_{U2}$ | $D_{U1}$ | $D_{U0}$ | |
| 0 | 0 | 0 | 0 | 0 | $S_{K1}$ |
| | 0 | 0 | 0 | 1 | $S_{K2}$ |
| | 0 | 0 | 1 | 0 | $S_{K3}$ |
| | ⋮ | ⋮ | ⋮ | ⋮ | ⋮ |
| | 1 | 1 | 1 | 1 | $S_{K16}$ |
| 1 | × | × | × | × | NOT SELECTED |

FIGURE 10

| IMAGE DATA | | | | | | | | OUTPUT VOLTAGE |
|---|---|---|---|---|---|---|---|---|
| MAIN DATA | | | | SUB DATA | | | | |
| $D_{U3}$ | $D_{U2}$ | $D_{U1}$ | $D_{U0}$ | $D_{U3}$ | $D_{U2}$ | $D_{U1}$ | $D_{U0}$ | |
| 0 | 0 | 0 | 0 | 0 | 0 | 0 | 0 | $V_{k1}+V_{C1}$ |
| 0 | 0 | 0 | 0 | 0 | 0 | 0 | 1 | $V_{k1}+V_{C2}$ |
| 0 | 0 | 0 | 0 | 0 | 0 | 1 | 0 | $V_{k1}+V_{C3}$ |
| | | ⁞ | | | ⁞ | | | ⁞ |
| 0 | 0 | 0 | 0 | 1 | 1 | 1 | 1 | $V_{k1}+V_{C16}$ |
| 0 | 0 | 0 | 1 | 0 | 0 | 0 | 0 | $V_{k2}+V_{C1}$ |
| | | ⁞ | | | ⁞ | | | ⁞ |
| 0 | 0 | 0 | 1 | 1 | 1 | 1 | 1 | $V_{k2}+V_{C16}$ |
| | | | ⁞ | | | | | |
| 1 | 1 | 1 | 1 | 1 | 1 | 1 | 1 | $V_{k16}+V_{C16}$ |

CIRCUIT FOR DRIVING LIQUID CRYSTAL DEVICE

This is a Continuation of application Ser. No. 08/161,733 filed Dec. 2, 1993, now abandoned.

BACKGROUND OF THE INVENTION

1. Field of the Invention

The present invention relates to a liquid crystal device driving circuit, and more specifically, to a circuit for driving a liquid crystal display panel capable of displaying an image with a multiple tone level.

2. Description of Related Art

In general, since the liquid crystal display panel is configured to be able to display an image having different gray scale levels, a circuit for driving the liquid crystal display panel is required to generate a plurality of different driving voltages of the number corresponding to the number of gray scale levels to be displayed. Therefore, the driving circuit is configured to receive image data to be displayed, and to perform various shifting and latching processings for the received data, and then to sequentially select one driving voltage level from the plurality of driving voltage levels in accordance with a latch output, so as to supply the selected driving voltage level to the liquid crystal display panel.

Here, referring to FIG. 1, there is shown a block diagram of one example of a conventional liquid crystal device driving circuit. As shown in FIG. 1, in the case of displaying a gray scale image in an active matrix liquid crystal display panel, the conventional liquid crystal device driving circuit has to supply a drive output voltage Vo corresponding to a required luminance, from a group of drive voltage output terminals Tl to Tk of a transistor switch circuit 3 to corresponding source lines.

For this purpose, a select/drive circuit includes "k" stages of "n"-bit shift registers 15a to 15k receiving an image input data from an image data input terminal, and a corresponding number of "n"-bit latches 16a to 16k each for latching the "n"-bit data of a corresponding one of the "n"-bit shift registers 15a to 15k. A group of selector circuits 14a to 14k are driven with select signals from the latches 16a to 16k. If the group of selector circuits 14a to 14k are driven, a gate of each of output transistors Qll to Qmk included in the transistor switch circuit 3 is controlled, so that a driving output voltage Vo is supplied from each of the driving output terminals Tl to Tk.

Namely, an "n"-bit digital image input data Vi indicative of "m" gray scale levels is supplied from the image data input terminal 7, and shifted and stored in the "n"-bit shift registers 15a to 15k in response to a clock pulse CK applied to a clock input terminal 1. In response to a latch pulse L applied to a latch pulse input terminal 2, the data stored in each of the registers is transferred to a corresponding one of the "n"-bit latches 16a to 16k.

The data latched in each latch controls a corresponding one of the selector circuits 14a to 14k in such a manner that one transistor of the first output stage transistors Qll to Qml connected to the drive output terminal Tl of the transistor switch circuit 3 is turned on, and one transistor of the "k"th output stage transistors Qlk to Qmk connected to the drive output terminal Tk is turned on. With this arrangement, voltage levels Vl to Vm corresponding to drain voltage terminals 8a to 8m of "m" gray scale levels are supplied, so that voltages of "m" gray scale levels are supplied to an external liquid crystal display.

For example, assuming that tit image input data Vi is composed of digital signals D0, D1, . . . , Dn−1, the voltage Vo appearing on the drive output terminal Tl is as shown in FIG. 2.

Namely, if the digital signals D0, D1, . . . , Dn−1 of the image input data Vi are (0, 0, . . . , 0), the transistor Qll connected to the output terminal Tl is turned on, and then, the output voltage Vo is brought to $V_l$. Accordingly, any one of the output transistors Qll to Qml corresponding to the digital signals D0, D1, . . . , Dn−1 of the image input data Vi is necessarily turned on.

In this approach, if it is attempted to increase the number of gray scale levels, the number of gray scale voltage supplies must be correspondingly increased, and the number of switches must also be increased. Therefore, not only a peripheral circuit becomes large, but also a chip size becomes large in the case that the driving circuit is implemented on a LSI (large-scaled integrated circuit). Accordingly, realizability drops.

Because of this reason, a liquid crystal device driver adopting this approach, which is now under a mass production, is on the order of 8 gray scale levels to 16 gray scale levels. For a full-color display, however, the liquid crystal display panel is going to be required to have a gray scale of 64 levels or more. Under this circumstance, in order to increase the number of gray scale levels, for example, Japanese Patent Application Laid-open No. Sho 63-182695 has proposed a field division method.

In this method, for example, the image is divided into a first field and a second field, and different voltages or the same voltage is generated so that the number of gray scale levels is apparently increased. In this conventional example, in a liquid crystal device driving circuit configured to select one from gray scale voltages in accordance with the image data by means of switching means similarly to the first mentioned conventional example, a "m"-bit image signal obtained by giving a difference of "1" to the most significant "m" bits of a "q"-bit image data ("q">"m") is generated by a compensation circuit. In addition, each frame of the input image signals is divided into "$2^{(q-m)}$" fields, and either the most significant "m" bits of the input image data or the "m" bits outputted from the compensation circuit is selected by a selecting means in accordance with the least significant "q-m" bits of the image data, and the selected "m" bits are supplied to the liquid crystal device driving circuit.

The compensating circuit either adds "1" to the value of the "m" bits or subtracts "1" from the value of the "m" bits. In the case of addition of "1", only the output of the compensating circuit corresponding to the least significant "q-m" bits of $2^{(q-m)}$ fields of one frame is supplied to the driving circuit, and on the other hand, the most significant "m" bits of the input image data is supplied directly to the driving circuit for the remaining portion.

In the case of subtracting "1" from the value of the "m" bits by the compensating circuit, only the output of the compensating circuit corresponding to the least significant "q-m" bits of $2^{(q-m)}$ fields of one frame is supplied to the driving circuit, and on the other hand, the most significant "m" bits of the input image data is supplied directly to the driving circuit for the remaining portion. With this feature, the number of gray scale levels can be apparently made to $2^q$. For example, in the case of q=4 and m=3, namely, when it is intended to obtain 16 gray scale levels with switches each having eight outputs, there is obtained a relation as shown in FIG. 3.

In the conventional liquid crystal device driving circuit shown in FIG. 1, if the number of gray scale levels is increased, low-impedance large-current-capacity, external voltage supplies of the number corresponding to the number of gray scale levels are required, and therefore, when the driving circuit is assembled in the liquid crystal display panel, the number of thick wiring conductors is increased and the liquid crystal display panel correspondingly becomes large. In addition, by increasing the number of pixels in the liquid crystal display panel, the driving circuit is required to have a further low impedance. Furthermore, if the number of gray scale levels is increased, when a buffer circuit having a low impedance and a large output capacity is implemented on the same semiconductor substrate, the chip size becomes extremely large, and therefore, the driving circuit becomes expensive.

On the other hand, the liquid crystal device driving circuit disclosed in Japanese Patent Application hid-open No. Sho 63-182695 makes it possible to obtain a multiple gray scale with a reduced number of driving circuits by the field division. But, the image quality drops. Namely, when an intermediate gray scale or half tone is generated with the compensating bits, the frame period of the half tone lowers. In addition, a flicker phenomenon and/or a moving phenomenon occurs. Because of these phenomena, the image quality drops.

Therefore, in order to drive the liquid crystal device with an excellent image quality, the liquid crystal device driving circuit itself has a function of supplying different-output voltages of the same number as that of gray scale levels during one horizontal period. If it is so modified, the problems of the conventional liquid crystal device driving circuit shown in FIG. 1 will occur.

SUMMARY OF THE INVENTION

Accordingly, it is an object of the present invention to provide a liquid crystal device driving circuit which has overcome the above mentioned defect of the conventional ones.

Another object of the present invention is to provide a low-cost liquid crystal device driving circuit and which can operate with a reduced number of external voltage supplies in order to drive a multiple gray scale liquid crystal device.

The above and other objects of the present invention are achieved in accordance with the present invention by a liquid crystal device driving circuit receiving a "m"-bit digital image signal (where "m" is an integer not less than 2) which can be divided into a first bit group including the least significant bit of the digital image signal and a second bit group including the most significant bit of the digital image signal, the circuit comprising:

a capacitor means;

a first charging means receiving the first bit group of the digital image signal and supplied with a plurality of first predetermined voltages, the first charging means selecting from the plurality of first predetermined voltages, one first predetermined voltage in accordance with the bit content of the first bit group, for supplying and charging the selected first predetermined voltage to the capacitor means; and a second charging means receiving the second bit group of the digital image signal and supplied with a plurality of second predetermined voltages, the second charging means selecting from the plurality of second predetermined voltages, one second predetermined voltage in accordance with the bit content of the second bit group, for additionally charging the selected second predetermined voltage to the capacitor means, in a superimposed manner, whereby a superimposed voltage appears on the capacitor means and is supplied as a liquid crystal device driving voltage.

The above and other objects, features and advantages of the present invention will be apparent from the following description of preferred embodiments of the invention with reference to the accompanying drawings.

BRIEF DESCRIPTION OF THE DRAWINGS

FIG. 2 is a table showing the relation between the image input data, the driving output voltage and the switching transistors in the circuit shown in FIG. 1;

FIG. 3 is a table illustrating the operation of the conventional liquid crystal device driving circuit;

FIG. 9 is a table showing the relation between the control signal H, the main data and the selection of the main switches Sk in the liquid crystal device driving circuit in accordance with the present invention; and FIG. 10 is a table showing the relation between the image data and the output voltage in the liquid crystal device driving circuit in accordance with the present invention.

DESCRIPTION OF THE PREFERRED EMBODIMENTS

Now, embodiments of the present invention will be described with reference to the drawings.

Figure 1:
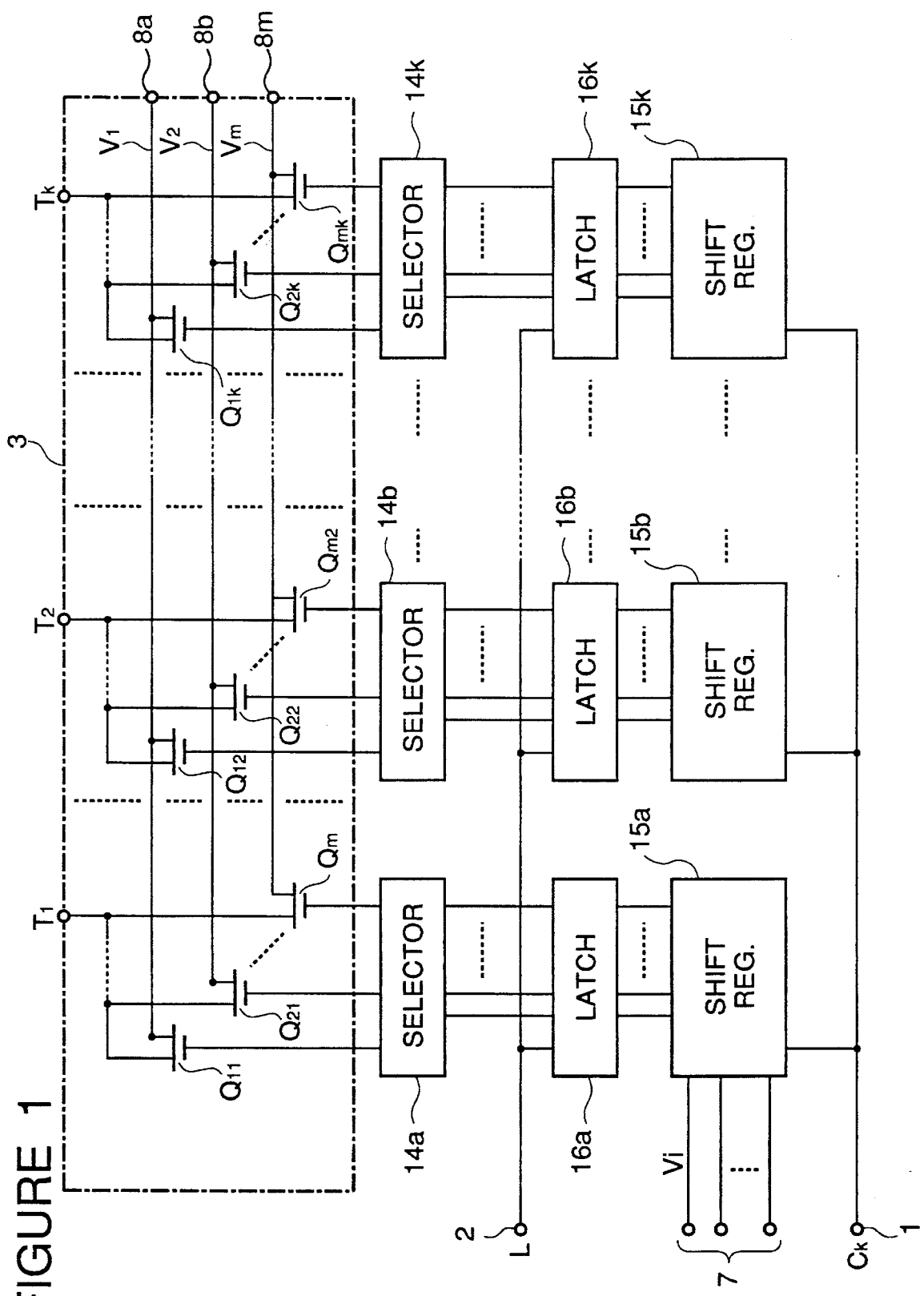
FIG. 1 is a block diagram showing an example of the conventional driving circuit for the multiple gray scale liquid crystal device.
Figure 4:
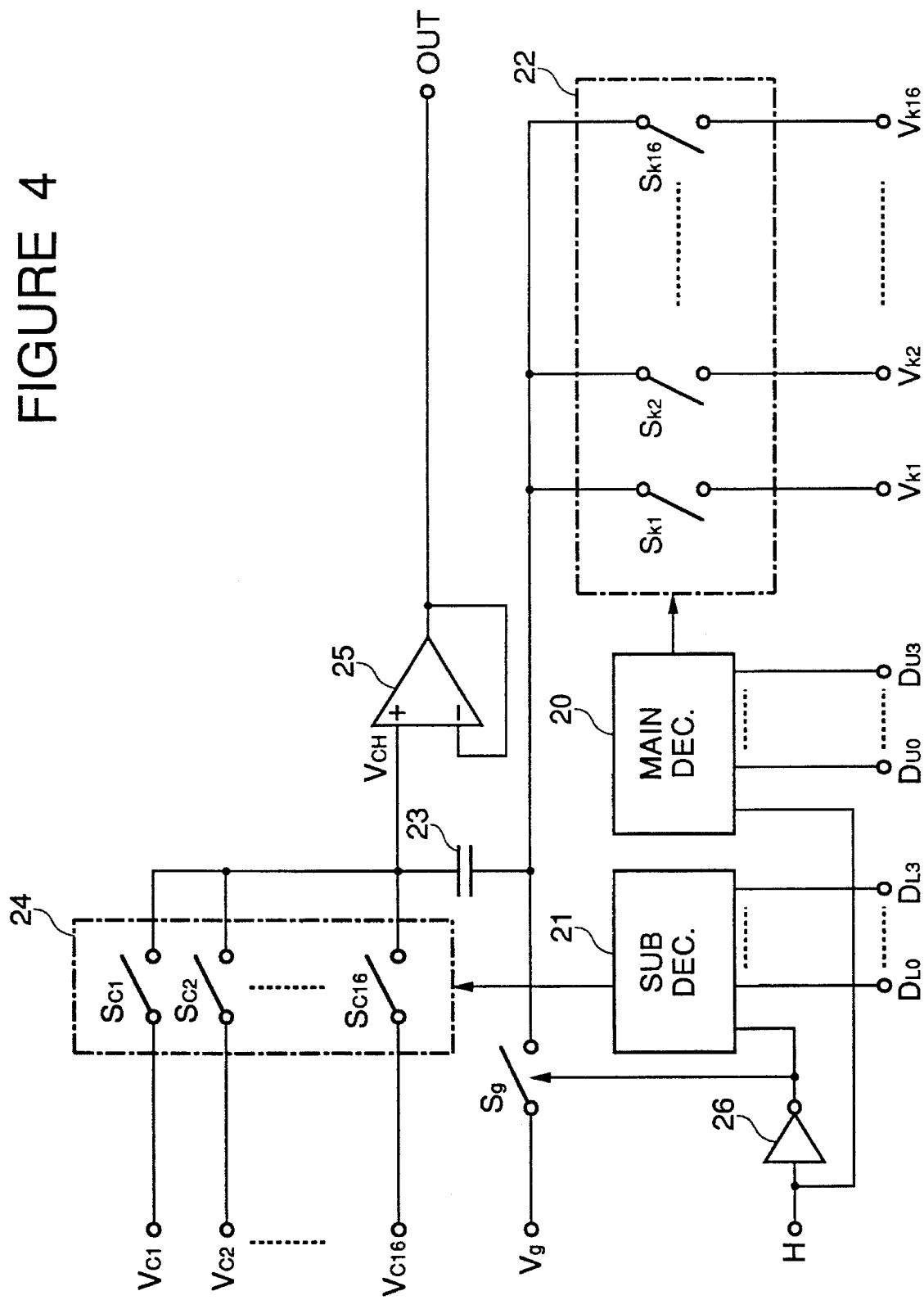
FIG. 4 is a circuit diagram showing a portion, in detail, of a liquid crystal device driving circuit in accordance with the present invention.

Referring to FIG. 4, there is shown a block diagram showing a circuit for generating a driving voltage, in a liquid crystal device driving circuit in accordance with an embodiment of the present invention. The shown embodiment is configured to receive image data of 8 bits ($D_{U3}$, $D_{U2}$, $D_{U1}$, $D_{U0}$, $D_{L3}$, $D_{L2}$, $D_{L1}$, $D_{L0}$) and to generate driving voltages of $2^8=256$ gray scale levels. In addition, the most significant bit of the 8-bit image data is labelled "$D_{U3}$", and the least significant bit of the 8-bit image data is labelled "$D_{L0}$". For convenience of the following description, the bits "$D_{U3}$" to "$D_{U0}$" of the 8-bit image data are called a "main bit data", and the bits "$D_{L3}$" to "$D_{L0}$" of the 8-bit image data are called a "sub (interpolating) bit data".

A main decoder 29 decodes the main bit data "$D_{U3}$" to "$D_{U0}$" of the 8-bit image data, and a sub decoder 21 decodes the sub bit data "$D_{L3}$" to "$D_{L0}$" of the 8-bit image data. A main switch circuit 22 includes 16 switches $S_{k1}$ to $S_{k16}$, only one of which is turned on in accordance with an output of the main decoder 20. One end of these switches $S_{k1}$ to $S_{k16}$ are connected to main voltages $V_{k1}$ to $V_{k16}$, respectively. The other end of the switches $S_{k1}$ to $S_{k16}$ are connected in common to a common terminal of a sample hold capacitor 23.

A sub switch circuit 24 also includes 16 switches $S_{C1}$ to $S_{C16}$. Only one of the switches $S_{C1}$ to $S_{C16}$ is selected and turned on in accordance with an output of the sub decoder 21. One end of these switches $S_{C1}$ to $S_{C16}$ are connected to sub voltages $V_{C1}$ to $V_{C16}$, respectively. The other end of the switches $S_{C1}$ to $S_{C16}$ are connected in common to a charging side terminal of the sample hold capacitor 23.

In addition, them is provided a switch Sg for controlling whether or not the common terminal of the sample hold capacitor 23 is connected to the ground level Vg. This switch Sg is controlled by an inverted signal of a control signal H. The inverted signal is supplied from an inverter 26. This control signal H activates the main decoder 20, and also activates the sub decoder 21 through the inverter 26.

A hold output voltage on the sample hold capacitor 23 is outputted through an output amplifier 25 as a driving voltage output OUT.

Figure 5:
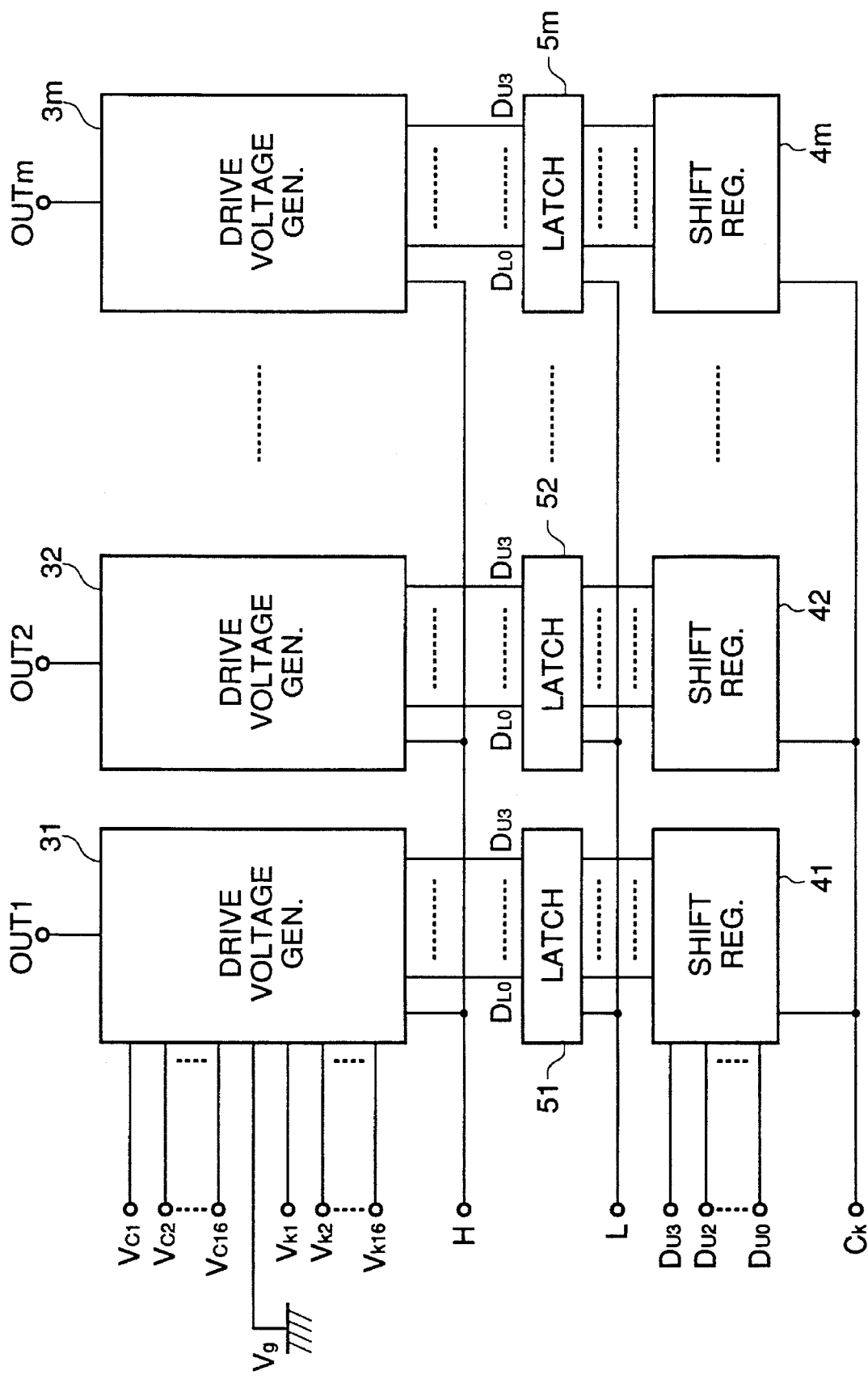
FIG. 5 is a block diagram of the overall structure of the liquid crystal device driving circuit in accordance with the present invention.

Referring to FIG. 5, there is shown a block diagram of a multiple gray scale liquid crystal device driving circuit constituted of "m" driving voltage generating circuits of the same structure as that of the driving voltage generating circuit shown in FIG. 4. In the shown embodiment, 8-bit shift registers $4l$ to $4m$ and 8-bit latches $5l$ to $5m$ are provided to corresponding to "m" driving voltage generating circuits $3l$ to $3m$, respectively.

Each of the shift registers $4l$ to $4m$ fetches the input image data by shifting the input image data by every 8 bits ($D_{U3}$ to $D_{L0}$) in synchronism to a clock signal CK, and in response to a latch pulse L, the 8-bit data of each shift register is latched in a corresponding latch $5_l$ to $5m$. The 8-bit latched data of the latches $5_l$ to $5m$ are supplied to the driving voltage generating circuits $3l$ to $3m$, respectively.

Figure 6:
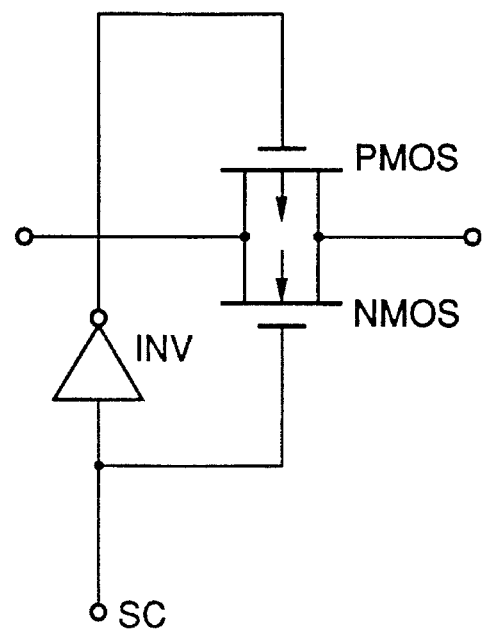
FIG. 6 is a diagram showing an example of a switch circuit used in the liquid crystal device driving circuit in accordance with the present invention.

Incidentally, the respective switches $S_C$, $S_k$ and Sg can be realized by using a well known transfer gate circuit as shown in FIG. 6. Namely, one N-channel transistor NMOS and a P-channel transistor PMOS are connected in parallel to each other, and a switch control signal SC is supplied to a gate of the N-channel transistor NMOS and through an inverter INV to a gate of the P-channel transistor PMOS. Thus, when the switch control signal SC is at a high level, both of the N-channel transistor NMOS and the P-channel transistor PMOS are turned on, namely, the transistor switch is turned on. When the switch control signal SC is at a low level, both of the N-channel transistor NMOS and the P-channel transistor PMOS are turned off, namely, the transistor switch is tamed off.

The input image data is sequentially transferred through the 8-bit shift registers $4_l$ to $4m$ in response to the clock pulse CK. In response to the latch pulse L, the data held in the registers are transferred and latched in the 8-bit latches $5_l$ to $5m$, respectively. The data latched in the latches $5_l$ to $5m$ are supplied to the driving voltage generating circuits $3l$ to $3m$, respectively.

Of the supplied image input data, the main data ($D_{U3}$, $D_{U2}$, $D_{U1}$, $D_{U0}$) is inputted to the main decoder 20. When the control signal H is "0", the main decoder 20 is activated to generate a signal for selecting one of the main switches $S_{k1}$ to $S_{k16}$. When the control signal H is "1", the main switches $S_{k1}$ to $S_{k16}$ are not selected, and on the other hand, the switch Sg is turned on and the sub (interpolating) decoder 21 is activated. A relation between the main data, the control signal H and the output of the main decoder 20 is shown in FIG. 9.

Of the supplied image input data, the sub (interpolating) data ($D_{L3}$, $D_{L2}$, $D_{L1}$, $D_{L0}$) is supplied to the sub decoder 21, which selectively turn on one of the sub (interpolating) switches $S_{C1}$ to $S_{C16}$. This selection is performed similarly to that performed by the main decoder 20.

Figure 8:
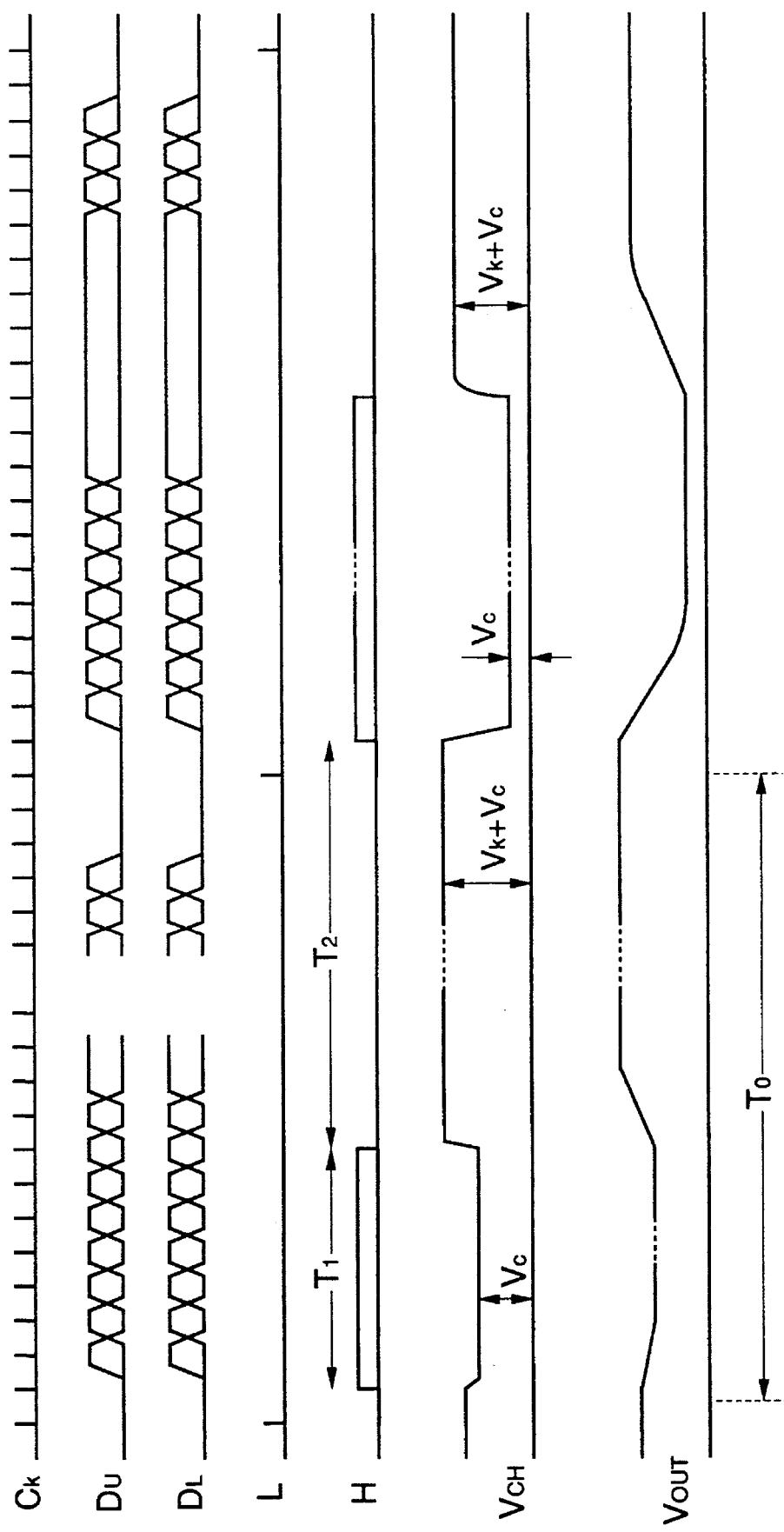
FIG. 8 is a timing chart illustrating the operation of the liquid crystal device driving circuit in accordance with the present invention.

Further, the operation of the shown embodiment of the present invention will be described with reference to the timing chart of FIG. 8. During a first (half) period $T_1$ of one horizontal period $T_0$, the control signal H is brought into "0". Accordingly, by action of the sub decoder 21 which receives the sub data ($D_{L3}$, $D_{L2}$, $D_{L1}$, $D_{L0}$) of the 8-bit image data ($D_{U3}$ to $D_{L0}$) latched one horizontal period before, a sub voltage Vc is supplied and charged through the sub switch Sc and the switch Sg to the sample hold capacitor 23. At this time, the voltage of Vg is 0 V.

At this time, since the main decoder 21 is put in an inactive condition, none of the main switches $S_{k1}$ to $S_{k16}$ is selected. Accordingly, an input voltage $V_{CH}$ of the output buffer amplifier 25 becomes the sub voltage Vc selected by the sub switch Sc.

During a second (half) period $T_2$ of the horizontal period $T_0$, the control signal H is brought into "1". Accordingly, the sub decoder 21 is put in an inactive condition, and the switch Sg is turned off. On the other hand, the main decoder 20 selects one main switch Sk in accordance with the received main data ($D_{U3}$ to $D_{U0}$), so that a corresponding gray scale level voltage Vk is supplied to the common-electrode of the sample hold capacitor 23.

Thus, the voltage $V_{CH}$ of the sample hold capacitor 23 becomes (Vk+Vc), so that the output voltage obtained by adding the sub voltage Vc and the gray scale voltage Vk is outputted from the output amplifier 25. With this arrangement, the relation between the image data and the output voltage becomes as shown in FIG. 10. Namely, if all the sub voltages $V_{C1}$, $V_{C2}$, ..., $V_{C16}$ are equally distributed in a range of a voltage difference between adjacent gray scale voltages Vkn and Vk(n+1), a voltage of 16×16=256 gray scale levels can be obtained.

Since the voltage pitch of the sub voltages $V_{C1}$, $V_{C2}$, ..., $V_{C16}$ is small, it is sufficient even if the sampling period $T_1$ is small in comparison with one horizontal period $T_0$. Accordingly, the period $T_2$ for greatly changing the output voltage can be made long, so that a load acting on the output amplifier can be small.

Incidentally, it is possible to supply both Of the sub or interpolating voltages Vc and the main or gray scale level voltages Vk from an external apparatus. Now, explanation will be made on a method of internally generating the interpolating voltages Vc, in the case that the liquid crystal device driving circuit in accordance with the present invention is implemented on a silicon chip as a second embodiment of the liquid crystal device driving circuit in accordance with the present invention.

Figure 7:
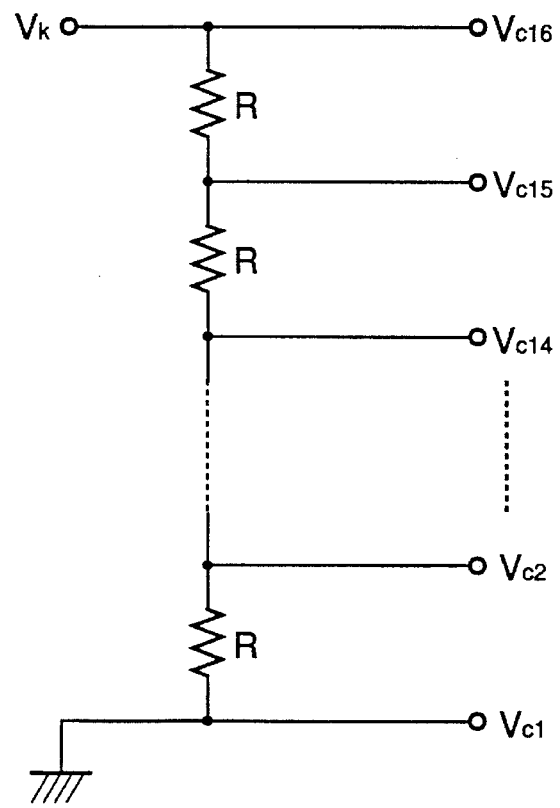
FIG. 7 is diagram showing an example of the sub or interpolating voltage generating circuit used in the liquid crystal device driving circuit in accordance with the present invention.

A circuit diagram of an interpolating voltage generating circuit is shown in FIG. 7. Voltage obtained by dividing a voltage $V_k$ of an external voltage supply by 15 series-connected resistors R, are used as the sub or interpolating voltages $V_{C1}$ to $V_{C16}$. In this case, it is sufficient if the voltage $V_k$ is on the order of 0.3 V to 0.4 V. Therefore, the number of terminals for external voltage supplies can be reduced without paying attention to a consumed electric power.

As mentioned above, according to the present invention, an externally or internally generated interpolating voltage is sampled and held in a sample hold capacitor, and a voltage of a selected main gray scale voltage supply is added to a common terminal of the sample hold capacitor, so that the interpolating voltage is added to the gray scale voltage level. Accordingly, the gray scale number {the number of interpolating voltages multiplied by the number of gray scale level voltages} can be obtained. Therefore, the number of switches in the driving voltage generating circuit can be reduced.

For example, in order to obtain 256 gray scale levels, 256 switches were required for each output in the prior an method, but in the present invention it is sufficient if (16×2=)32 switches are provided. Therefore, if the liquid crystal device driving circuit in accordance with the present invention is implemented on a silicon chip, the chip size can be reduced, and therefore, the cost can be also decreased. In addition, the number of wiring conductors for supplying the voltages to the liquid crystal device driving circuit and the number of their associated switches can be correspondingly reduced.

The flicker phenomenon and the moving phenomenon which had occurred in the case of the multiple gray scale realized by the conventional field dividing method, will not occur at all, since the 256 gray scale level voltages can be generated during each one horizontal period. Therefore, a high quality image can be displayed in the liquid crystal device.

The invention has thus been shown and described with reference to the specific embodiments. However, it should be noted that the present invention is in no way limited to the details of the illustrated structures but changes and modifications may be made within the scope of the appended claims.

I claim:

1. A liquid crystal device driving circuit receiving a "m"-bit digital image signal, where "m" is an integer not less than 2, for being divided into a first bit group including the least significant bit of the digital image signal and a second bit group including the most significant bit of the digital image signal, the circuit comprising:

capacitor means;

means for supplying a plurality of first predetermined voltages;

means for supplying a plurality of second predetermined voltages;

first charging means, having means for receiving said first bit group of said digital image signal and means for receiving said plurality of first predetermined voltages, and having means for selecting from said plurality of first predetermined voltages one first predetermined voltage in accordance with a bit content of said first bit group, and having means for supplying and charging the selected first predetermined voltage to said capacitor means during a first period of each one horizontal period; and second charging means, having means for receiving said second bit group of said digital image signal and means for receiving said plurality of second predetermined voltages, and having means for selecting from said plurality of second predetermined voltages one second predetermined voltage in accordance with a bit content of said second bit group, and having means for additionally charging the selected second predetermined voltage to said capacitor means, in a superimposed manner during a second period of said each one horizontal period, said each one horizontal period comprising said first period followed by said second period, whereby a superimposed voltage appears on said capacitor means and is supplied as a liquid crystal device driving voltage.

2. A liquid crystal device driving circuit claimed in claim 1 wherein said first charging means includes a plurality of first switching means each having a first end connected to receive said first predetermined voltages, respectively, a second end of each of said first switching means being connected in common to a first end of said capacitor means, and first decoder means receiving said first bit group of said image signal for controlling said first switching means so that a switching means of said first switching means is selected and turned on in accordance with the bit content of said first bit group, and wherein said second charging means includes a plurality of second switching means each having a first end connected to receive said second predetermined voltages, respectively, a second end of each of said second switching means being connected in common to a second end of said capacitor means, and second decoder means receiving said second bit group of said image signal for controlling said second switching means so that a switching means of said second switching means is selected and turned on in accordance with the bit content of said second bit group.

3. A liquid crystal device driving circuit according to claim 2 having means to turn on said selected switching means of said first switching means during said first period of said each one horizontal period, and having means to turn one said selected switching means of said second switching means during said second period of said each one horizontal period.

4. A liquid crystal driving circuit according to claim 3 wherein said second end of said capacitor means is grounded during said first period of said each one horizontal period, and is connected to the commonly connected second end of said switching means.

5. A liquid crystal device driving circuit according to claim 3 wherein said plurality of first predetermined voltages are different from each other and are distributed in a voltage range corresponding to a voltage difference between two adjacent second predetermined voltages, and said plurality of second predetermined voltages are different from each other.

6. A liquid crystal device driving circuit according to claim 1, wherein said first charging means includes:

a plurality of first switching means each having a first end connected to receive said first predetermined voltages, respectively, a second end of each of said first switching means being connected in common to a first end of said capacitor means, and first decoder means receiving said first bit group of said image signal for controlling said first switching means so that a switching means of said first switching means is selected and turned on in accordance with the bit content of said first bit group.

7. A liquid crystal device driving circuit according to claim 6, wherein said second charging means includes:

a plurality of second switching means each having a first end connected to receive said second predetermined voltages, respectively, a second end of each of said second switching means being connected in common to a second end of said capacitor means, and second decoder means receiving said second bit group of said image signal for controlling said second switching means so that a switching means of said second switching means is selected and turned on in accordance with the bit content of said second bit group.

8. A liquid crystal device driving circuit according to claim 7 wherein said first decoder means is controlled to turn on said selected switching means of said first switching means during said first period of said each one horizontal period.

9. A liquid crystal device driving circuit according to claim 8, wherein said second charging means is controlled to turn on said selected switching means of said second switching means during said first period of said each one horizontal period.

10. A liquid crystal device driving circuit according to claim 1, wherein said plurality of first predetermined voltages are different from each other and are distributed in a voltage range corresponding to a voltage difference between two adjacent second predetermined voltages, and said plurality of second predetermined voltages are different from each other.

11. A liquid crystal device driving circuit according to claim 1, wherein said plurality of first predetermined voltages are different from each other and are distributed in a voltage range corresponding to a voltage difference between two adjacent second predetermined voltages, and said plurality of second predetermined voltages are different from each other.

12. A liquid crystal device driving circuit according to claim 1, wherein said capacitor means comprises a single capacitor.

13. A liquid crystal device driving circuit according to claim 1,
wherein said capacitor means comprises a single capacitor and
wherein said first charging means includes a plurality of first switching means, each of said first switching means having a first end connected to receive said first predetermined voltages, respectively, and
wherein said second charging means includes a plurality of second switching means, each of said second switching means having a first end connected to receive said second predetermined voltages, respectively.

14. A liquid crystal device driving circuit according to claim 1, wherein said capacitor means comprises only one capacitor, said liquid crystal device driving voltage being produced by said capacitor in combination with said first and second charging means, said first and second charging means comprising first and second groups of switches, respectively.

15. A liquid crystal device driving circuit according to claim 3, wherein said capacitor means comprises a single capacitor.

16. A liquid crystal device driving circuit according to claim 2, wherein said capacitor means comprises a single capacitor.

17. A liquid crystal device driving circuit receiving a "m"-bit digital image signal, where "m" is an integer not less than 2, for being divided into a first bit group including the least significant bit of the digital image signal and a second bit group including the most significant bit of the digital image signal, the circuit comprising:
a capacitor;
means for supplying a plurality of first predetermined voltages, each of said first predetermined voltages being different from other of said first predetermined voltages;
means for supplying a plurality of second predetermined voltages, each of said second predetermined voltages being different from other of said second predetermined voltages;
first charging means, having:
means for receiving said first bit group of said digital image signal,
means for receiving said plurality of first predetermined voltages,
means for selecting from said plurality of first predetermined voltages one of said first predetermined voltages in accordance with the bit content of said first bit group, and
means for supplying the selected first predetermined voltage to one end of said capacitor during a first period of each one horizontal period, said first charging means being disconnected from said one end of said capacitor during a second period of said each one horizontal period, said each one horizontal period being constituted of said first period followed by said second period; and
second charging means, having:
means for receiving said second bit group of said digital image signal,
means for receiving said plurality of second predetermined voltages,
means for selecting from said plurality of second predetermined voltages one of said second predetermined voltage in accordance with the bit content of said second bit group, and
means for supplying the selected second predetermined voltage to the other end of said capacitor during said second period of said each one horizontal period, said second charging means being disconnected from said other end of said capacitor during said first period of said each one horizontal period, wherein,
during said first period of said each one horizontal period, said one end of said capacitor is connected to said first charging and said other end of said capacitor is disconnected from said second charging means, so that said capacitor is charged by said first charging means, and during said second period of said each one horizontal period, said one end of said capacitor is disconnected from said first charging means but connected to output means, and said other end of said capacitor is connected to said second charging means, whereby a superimposed voltage appears on said one end of said capacitor, and is supplied through said output means as a liquid crystal device driving voltage.

18. A liquid crystal device driving circuit according to claim 17 wherein said output means includes an output amplifier.

19. A liquid crystal device driving circuit according to claim 17 wherein during said first period of each one horizontal period, said other end of said capacitor is connected to ground.

20. A liquid crystal device driving circuit receiving a "m"-bit digital image signal, where "m" is an integer not less than 2, for being divided into a first bit group including the least significant bit of the digital image signal and a second bit group including the most significant bit of the digital image signal, the circuit comprising:
a capacitor;
means for supplying a plurality of first predetermined voltages, each of said first predetermined voltages being different from other of said first predetermined voltages;

means for supplying a plurality of second predetermined voltages, each of said second predetermined voltages being different from other of said second predetermined voltages;

first charging means including a plurality of first switching means each having a first end connected to receive a corresponding one of said first predetermined voltages, respectively, a second end of each of said first switching means being connected in common to a first end of said capacitor, and first decoder means having means for receiving said first bit group of said digital image signal, means for selecting a switching means of said first switching means in accordance with the bit content of said first bit group, and means for turning on said selected switching means of said first switching means during a first period of said each one horizontal period, said first decoder means maintaining said first switching means in an off condition during a second period of said each one horizontal period, said each one horizontal period being constituted of said first period followed by said second period; and second charging means including a plurality of second switching means each having a first end connected to receive a corresponding one of a plurality of second predetermined voltages, respectively, a second end of each of said second switching means being connected in common to a second end of said capacitor, and second decoder means having means for receiving said second bit group of said digital image signal and means for selecting a switching means of said second switching means in accordance with the bit content of said second bit group, and means for turning on said selected switching means of said second switching means during said second period of said each one horizontal period, said second decoder means maintaining said second switching means in an off condition during said first period of said each one horizontal period, wherein, during said first period of said each one horizontal period, said one end of said capacitor is connected to said turned-on selected switching means of said first switching means and said other end of said capacitor is disconnected from said second charging means, so that said capacitor is charged to one of said plurality of first predetermined voltages through said turned-on selected switching means of said first switching means, and during said second period of said each one horizontal period said one end of said capacitor is disconnected from said first charging means, and said other end of said capacitor is connected to receive one of said plurality of second predetermined voltages through said turned-on selected switching means of said second switching means, whereby a superimposed voltage appears on said one end of said capacitor, and is supplied as a liquid crystal device driving voltage.

21. A liquid crystal device driving circuit according to claim 20 wherein said first charging means connects said other end of said capacitor to ground during said first period of each one horizontal said period.

* * * * *